United States Patent [19]

Kubinec

[11] Patent Number: 4,985,905
[45] Date of Patent: Jan. 15, 1991

[54] TWO PHASE CMOS SHIFT REGISTER BIT FOR OPTIMUM POWER DISSIPATION

[75] Inventor: James J. Kubinec, Incline Village, Nev.

[73] Assignee: Advanced Micro Devices, Inc., Sunnyvale, Calif.

[21] Appl. No.: 521,007

[22] Filed: May 7, 1990

Related U.S. Application Data

[63] Continuation of Ser. No. 251,725, Sep. 30, 1988, abandoned.

[51] Int. Cl.[5] .................... H03K 23/44; H03K 3/286; G11C 11/412
[52] U.S. Cl. ........................................ 377/79; 307/279; 377/72
[58] Field of Search ........................... 377/72, 74, 79; 307/279, 291

[56] References Cited

U.S. PATENT DOCUMENTS

| T913,008 | 8/1973 | Beausoleil | 377/68 |
|---|---|---|---|
| 3,586,875 | 6/1971 | Nicklas | 377/79 |
| 3,641,360 | 2/1972 | Yao | 377/79 |
| 3,665,210 | 5/1972 | Ho et al. | 365/154 |
| 3,812,384 | 5/1974 | Skorup | 307/279 |
| 4,322,635 | 3/1982 | Redwine | 377/54 |
| 4,446,567 | 5/1984 | Iida et al. | 377/81 |
| 4,484,087 | 11/1984 | Mazin et al. | 377/79 |
| 4,703,200 | 10/1987 | Zangara | 377/79 |
| 4,705,965 | 11/1987 | Stuyt | 307/279 |

OTHER PUBLICATIONS

IBM Tech. Disclosure Bul. vol. 12, No. 12 pp. 2144, 2145–May, 1970 "Complementary FET Dynamic Shift Register Using Single Phase Line" by Gaensslen et al.

Primary Examiner—John S. Heyman
Attorney, Agent, or Firm—Skjerven, Morrill, MacPherson, Franklin & Friel

[57] ABSTRACT

Apparatus for formation of a two-phase shift register bit that preserves noise margins, allows use of reduced standby power, requires only two clock phase signals to drive the system, and requires relatively few transistors for implementation. In one embodiment, the apparatus uses two modules that are substantially identical, each module using four transistors and requiring only a single clock phase signal for operation.

3 Claims, 4 Drawing Sheets

TWO PHASE CMOS SHIFT REGISTER BIT FOR OPTIMUM POWER DISSIPATION

This application is a continuation of application Ser. No. 07/251,725, filed Sept. 30, 1988, now abandoned

FIELD OF THE INVENTION

This invention relates to shift registers in a computer for forming and holding data bits.

BACKGROUND OF THE INVENTION

Dynamic shift registers are used in computers for a variety of purposes. FIG. 1 shows one well known logic diagram for a dynamic shift register bit. A data bit appears at the input terminal and is blocked by a first data passage control means or transfer gate T1 until T1 senses the next rising edge or next falling edge of a clock pulse CLK1 received thereat. The electric charge associated with the data bit held at T1 is stored in a capacitor such as C1. When T1 allows passage of the data bit (conventionally assumed to be a "0" or a "1"), this bit is logically inverted by a first inverter INV1 and passed to a second bit passage control means or transfer gate T2, which allows passage of the bit only upon receipt thereafter of a rising edge or a falling edge of a second independent clock pulse CLK2. The electric charge associated with the bit held at T2 is stored in a capacitor such as C2; and when T2 releases the bit for passage, the bit is again logically inverted by an inverter INV2 so that the data bit appearing at the output is substantially the same as the data bit appearing at the input. The two clock pulses received from clock pulse sources CLK1 and CLK2 received at bit passage control means T1 and T2, respectively, are drawn from independent clock pulse sequences as shown in FIG. 2, the only constraint being that between any two consecutive pulses of CLK1 a single pulse of CLK2 must appear, and conversely. The clock pulses associated with CLK1 and CLK2 are to be nonoverlapping. The two-phase shift register shown schematically in FIG. 1 has been used throughout the industry for more than twenty years. After one pulse from CLK1 and one pulse from CLK2, the data bit that appeared earlier at the input terminal will appear at the output terminal of this device.

For reference purposes, FIG. 3 shows a common implementation of the two-phase dynamic shift register using n-channel conductivity type MOS transistors T1–T6 for this purpose. Transistors T1 and T4 serve as the transfer gates, TG1 and TG2, respectively, in FIG. 1; transistors T2 and T3 together comprise the inverter INV1; and transistors T5 and T6 together comprise the inverter INV2. Note that each data bit processed requires six transistors and delivery of two clock pulses. One problem that recurs here is that, when a "1" data bit appears at the input terminal in FIG. 3, the bit information transferred from drain (D1) to source (S1) upon subsequent receipt of a clock pulse from clock pulse source CLK1 will not be a true "1" bit because the gate voltage and the source voltage will become substantially equal as the "1" data bit is transferred from drain to source; this will reduce the resulting source-gate voltage difference $V_{GS1}$ at transistor T1 to below the threshold $V_{GS,T}$ ($\sim 1$ volt) for transistor turn-on, thus turning the transistor off, arresting charge build-up, and fixing the voltage for the data bit appearing at the source S1 at a value $V_{cc} - V_{GS,T} < V_{cc}$. This will reduce the noise margin of the gate voltage $V_{G2}$ appearing at the gate G2 of MOS transistor T2 by an amount $V_{GS,T}$. A similar difficulty occurs at the transfer gate T4. No such difficulty presents itself in the transfer of a "0" data bit at transfer gate T1 and/or T4 as the voltage difference $V_{GS1}$ does not become substantially zero. If the n-channel MOS transistors T1 and T4 in FIG. 3 are replaced by p-channel conductivity type MOS transistors, these p-channel transistors will face an analogous difficulty in transferring a "0" data bit across themselves but will face no such difficulty in transferring a "1" data bit thereacross. In order to provide adequate noise margin for the data bit signals that arrive at the gates G2 and G4 in FIG. 3, increased voltage must be provided, which requires substantial, and often unacceptable, standby power and additional interconnections through the voltage supply $V_{cc}$.

FIG. 4 illustrates a common CMOS implementation for a two-phase shift register that has the inherent benefit that it requires no additional standby power. An n-channel CMOS transistor T1 and a p-channel CMOS transistor T2 are connected drain-to-drain and source-to-source as shown, and the gates G1' and G2' of these two transistors receive complementary clock pulses CLK and CLK*. When a "1" data bit appears at the input terminal in FIG. 4, the transfer gate T2' transfers a true "1" irrespective of the value of this data bit transferred by transfer gate T1'; the data bit "1" will, of course, be transferred at different times by the gates T1' and T2'. When a "0" data bit arrives at the input terminal, transfer gate T1' will transfer a true "0" bit irrespective of the reduced value transferred by transfer gate T2', again at slightly different times. The result of this configuration is that the data bit that arrives at the common source S' shown in FIG. 4 is a true "0" data bit or a true "1" data bit, and no increase in standby power is required to preserve noise margins. A similar result occurs at the combination of transfer gates T5' and T6' shown in FIG. 4.

However, the configuration shown in FIG. 4 requires eight CMOS transistors and delivery of four different clock phase signals and thus requires more semiconductor real estate than the simpler configuration shown in FIG. 3. FIGS. 5 and 6 compare schematically the requirements of the simpler n-channel system indicated in FIG. 3 with the more complex CMOS configuration required by FIG. 4.

SUMMARY OF THE INVENTION

One object of this invention is to provide a two-phase shift register that preserves noise margins with reduced standby power and that requires delivery of only two clock phase signals.

Other objects of the invention, and advantages thereof, will become clear by reference to the detailed description and the accompanying drawings.

In order to achieve the objects of the invention in accordance with one embodiment discussed herein, the invention may include: a first module having a data input terminal, a clock input terminal, a power supply terminal and a data output terminal and comprising: a first MOS transistor having a drain, a gate and a source, with the drain being connected to the module input terminal and the gate being connected to the clock input terminal; an array of MOS transistors comprising at least a second MOS transistor of n-channel conductivity type and a third MOS transistor of p-channel conductivity type, with the gates of the second and third MOS transistors of this array each being connected to the source of the first transistor, with the drains of the second and third transistors each being connected to the output terminal of the first module, with the source of the second transistor being connected to the ground terminal and with the source of the third transistor being connected to the power supply terminal; where this array provides a gate voltage at the gates of the second and third transistors that is substantially equal to the voltage at the power supply terminal when the gate of the first transistor passes a signal voltage that is higher than a predetermined voltage, and this array provides a gate voltage that is substantially equal to the voltage at the ground terminal when the gate of the first transistor passes a signal voltage that is less than the predetermined voltage; and a second module that is substantially identical with the first module, wherein the input terminal of the second module is connected to the output terminal of the first module and two consecutive clock signals received at the clock input terminal of the first module are separated in time by one clock signal received at the clock input terminal of the second module, thereby providing two independent sequences of clock signals.

DETAILED DESCRIPTION

Figure 1:
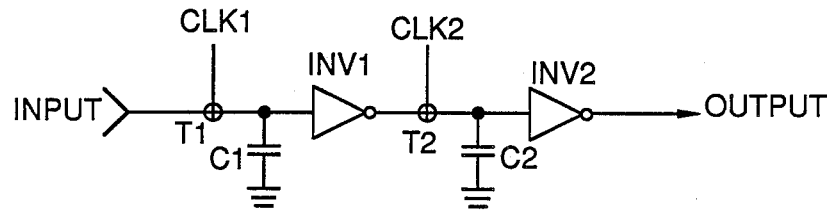
FIG. 1 is a schematic view of a generalized two-phase shift register for a single bit.
Figure 2:
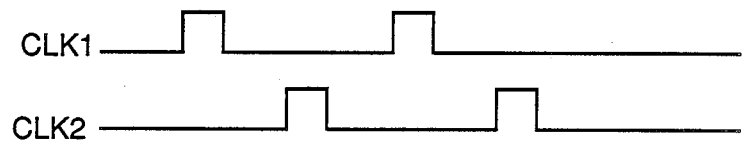
FIG. 2 is a graphic view of a sequence of pulses produced by two clock phase signal sources.
Figure 3:
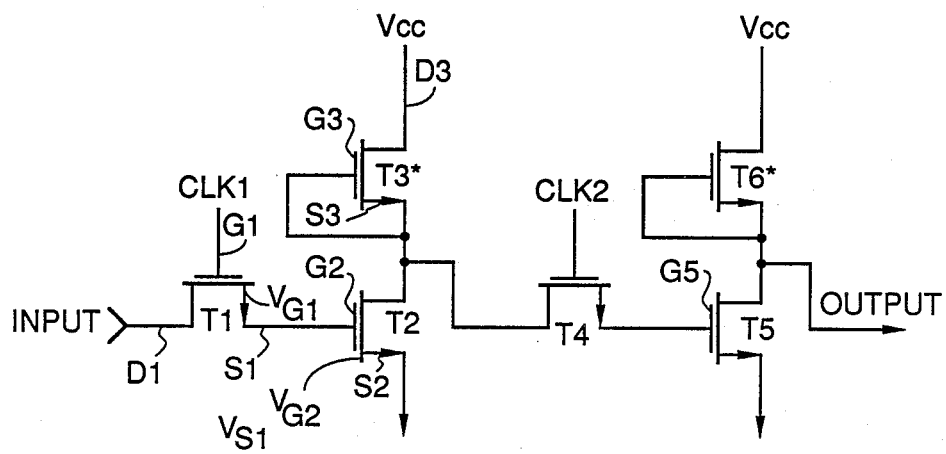
FIG. 3 is a schematic view of a two-phase shift register that uses six n-channel MOS transistors to achieve the desired results.
Figure 4:
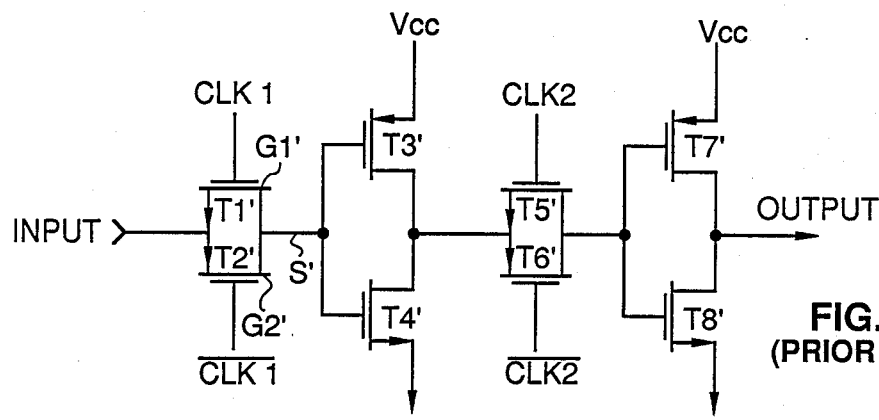
FIG. 4 is a schematic view of a two-phase p-channel/n-channel shift register that uses eight transistors and four clock phase signals but requires reduced standby power relative to the configuration in FIG. 3.
Figure 5:
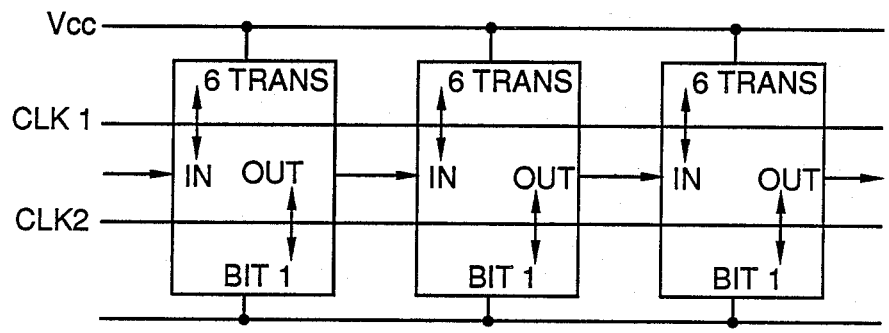
FIGS. 5 and 6 compare the complexity of the two-phase shift registers used in FIG. 3 and FIG. 4, respectively.
Figure 6:
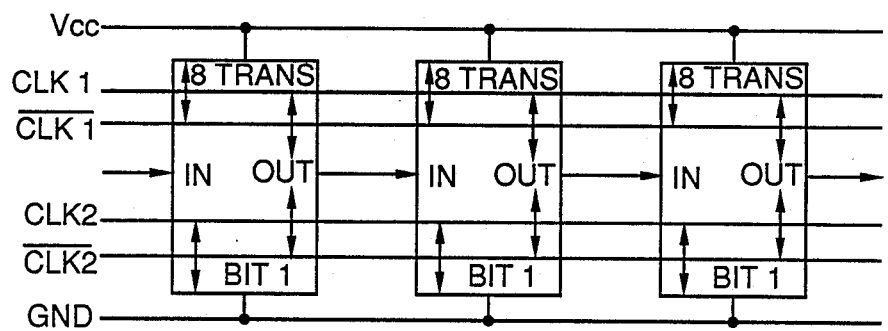
Figure 7:
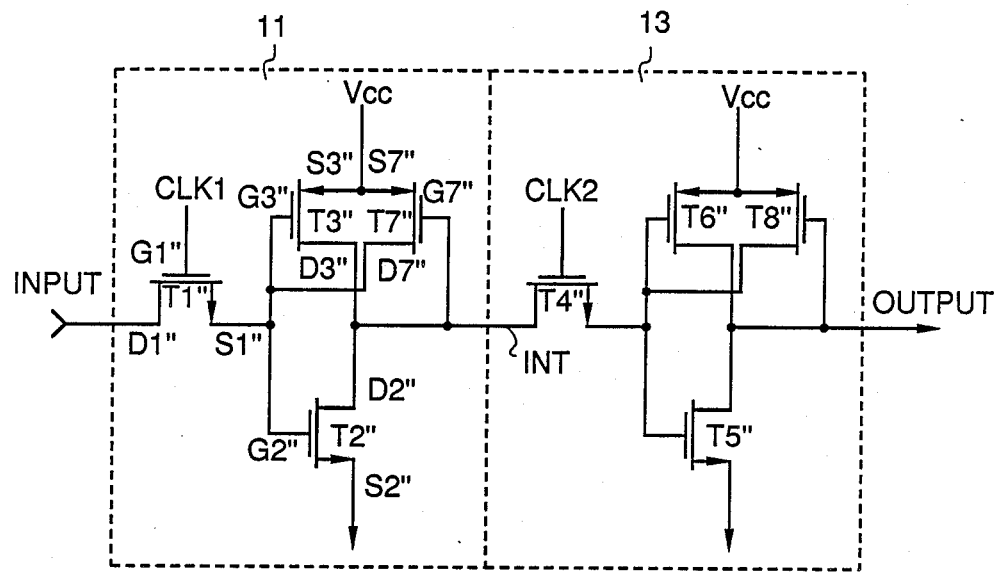
FIGS. 7, 8, 9 and 10 are four schematic views of different embodiments of a two-phase shift register according to the invention that requires reduced standby power, using a total of eight n-channel and p-channel CMOS transistors and two clock pulse sequences.

FIG. 7 shows one preferred embodiment of the invention. In this configuration, an NMOS transistor T1″ has its drain connected to the device input terminal and its gate driven by a clock phase source CLK1. The source S1″ of NMOS transistor T1″ is connected to the gate G2″ of an NMOS transistor T2″ whose source S2″ is connected to ground, and is connected to the gate G3″ of a PMOS transistor T3″ whose source is connected to a power supply $V_{cc}$. The drains D2″ and D3″ of the transistors T2″ and T3″, respectively, are both connected to the gate G7″ of a PMOS transistor T7″ whose source is also connected to the power supply $V_{cc}$. The drain of transistor T7″ is connected to the source of transistor T1″. The module 11 comprising an input terminal for the clock phase source CLK1, the data input terminal, and the four transistors T1″, T2″, T3″ and T7″ produces an output signal at the point denoted INT, and the output signal of the module 11 serves as the (intermediate) data input signal for the module 13, which is configured identically to module 11. Each of modules 11 and 13 comprises one phase of a two-phase shift register here. The source and drain of any transistor shown in any of FIGS. 7–10 are interchangeable here.

Consider first the action of module 11 with the p-channel transistor T7″ removed therefrom. If a "1" data bit arrives at the input terminal for module 11, the next clock pulse from clock phase source CLK1 will produce a "1" at the source of transistor T1″, and this "1" data bit will also appear at the gates of transistors T2″ and T3″. This will turn transistor T2″ on so that the voltage at the drain of transistor T2″ will be substantially zero. Appearance of a "1" data bit at the gate of PMOS transistor T3″ will leave the gate closed so that the voltage at the drain of transistor T3″ will be whatever is the drain voltage appearing at transistor T2″ to which it is connected. This configuration, by itself, may experience the previously-discussed problem that a true "1" data bit may not appear at the source of transistor T1″.

If a "0" data bit appears at the input terminal of the module 11, a "0" data bit will appear at the source of transistor T1″ after the next pulse from clock phase source CLK1, and this "0", data bit will also appear at the gates of transistors T2″ and T3″. This will leave the gate at transistor T2″ closed and will open the gate at transistor T3″ so that the drain voltage for transistor T3″, which is substantially the voltage of the power supply $V_{cc}$ and corresponds to a "1" data bit, appears at the output terminal of module 11 as required. No problem occurs where a "0" data bit appears at the input terminal of the module 11.

Now assume that the PMOS transistor T7″ is included in the module 11 as shown. When a "1" data bit arrives at the input terminal for the module 11, the next clock pulse from the clock phase source CLK1 will transfer the "1" data bit to the gates G2″ and G3″ of NMOS transistor T2″ and PMOS transistor T3″, respectively, as before. As before, a logical "0" will appear at the common drain of the transistors T2″ and T3″; and this logical "0" will also appear at the gate G7″ of PMOS transistor T7″, which will open the gate of transistor T7″ and set the voltage on the drain of T7″ equal to the voltage of the power supply $V_{cc}$ (which corresponds to a logical "1"). The appearance of the voltage $V_{cc}$ at the drain D7″ of T7″, will aid in pulling up the voltage of the source S1″ of transistor T1″ in response to a transfer of a "1" data bit through the transistor T1″. Thus, a true "1" data bit will appear at the source of transistor T1″. When a "0" data bit appears at the input terminal of the module 11, the next clock pulse from the clock phase source CLK1 will, as before, produce a logical "0" at the gates of transistors T2″ and T3″; this will open gate T3″ so that the voltage at the source of T3″ becomes substantially the voltage of the power supply $V_{cc}$. The voltage at the gate G7″ of transistor T7″ also becomes substantially the power supply voltage, and the gate G7″ remains closed so that a logical "0" that appears at the source S1″ of transistor T1″ is undisturbed. The signal that appears at the output terminal INT for the module 11 is then a logical "1" as desired. The module 13 operates in an analogous manner.

Figure 8:
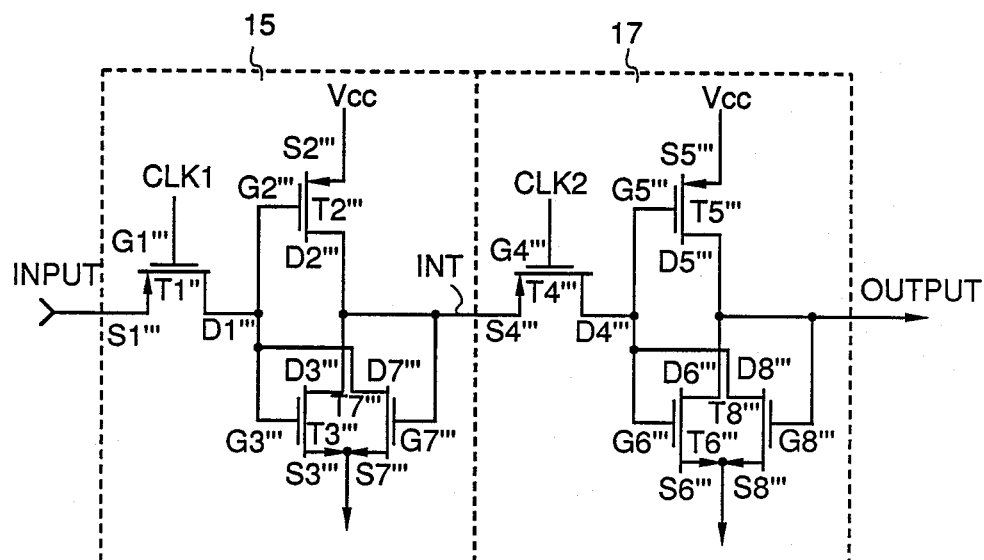

FIG. 8 illustrates a second preferred embodiment of the invention, wherein the NMOS transistors T2″ and T5″ are replaced by PMOS transistors T2‴ and T5‴, respectively, and the source connections to ground of T2″ and T5″ are replaced by connections to the power supply terminal, which may be held at a voltage $V_{cc}$;

and the PMOS transistor T3", T6", T7" and T8" are replaced by NMOS transistors T3''', T6''', T7''', and T8''', respectively, and the respective connections to the power supply terminal are replaced by connections to a ground terminal for each of these four NMOS transistors. Analysis of operation of the circuit shown in FIG. 8 proceeds as before. If a "1" data bit arrives at the drain of transistor T1''', when the clock source CLK1 next pulses low this "1" data bit will be transferred to the drain D1''' and to the gates G2''' and G3''' of the transistors T2''' and T3'''. This will open gate G3''' so that the voltage of the drain D3''' drops to zero, and this value appears at the intermediate node INT at the interface between the module 15 and the module 17 that comprise the circuit in FIG. 8. This performs the standard bit inversion operation. If a "0" data bit arrives at the source S1''' of transistor T1''', when the clock source CLK1 next goes low this "0" data bit will be transferred to the drain D1''' and to the gates G2''' and G3''' of the transistors T2''' and T3'''; this will open gate G2''' so that the voltage at drain D2''', at the intermediate node INT, and at gate G7''' becomes equal to $V_{cc}$. This opens gates G7''' and forces the voltage at drain D7''' to ground potential, thus reproducing a true "0" data bit at the drain D1''' as desired.

Figure 9:
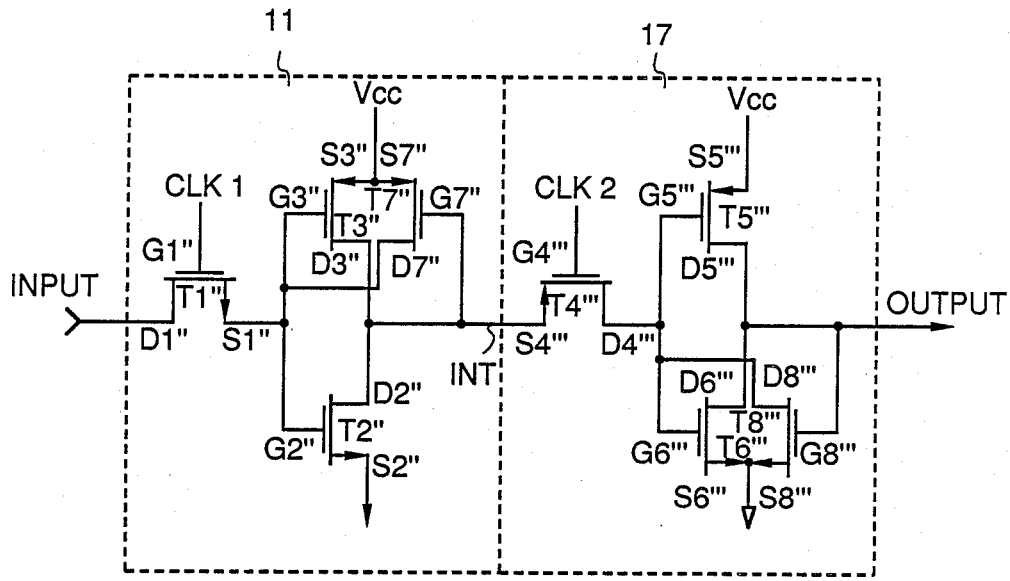
Figure 10:
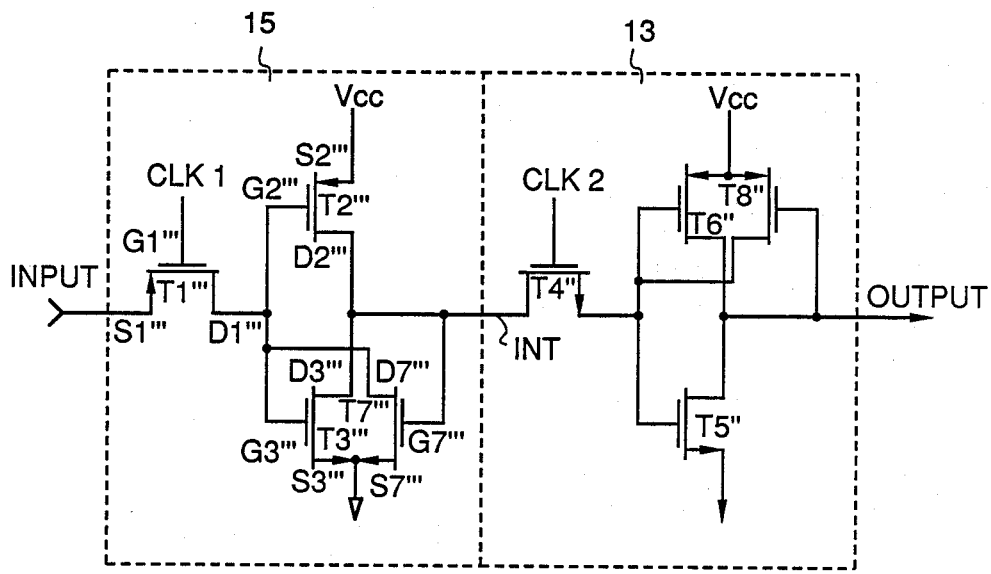

FIG. 9 illustrates a third preferred embodiment in which the modules 11 and 17 from FIGS. 7 and 8, respectively, are connected to produce a similar result; and FIG. 10 illustrates a fourth preferred embodiment in which the modules 15 and 13 from FIGS. 8 and 7, respectively, are connected as shown to produce a similar result.

The circuits shown in modules 11 and 15 in FIGS. 7 and 8 are duals of one another in a certain sense: if each NMOS transistor and its associated external supply source voltage (at the ground terminal) is replaced by a PMOS transistor and its associated external supply source voltage (at the power supply terminal), and each PMOS transistor and its associated external supply source voltage is replaced by an NMOS transistor and its associated external supply source voltage, ignoring the input transistors T1" and T1''', the modules 11 and 15 are transformed into one another.

Although the preferred embodiments of the invention have been shown and described herein, variation and modification may be made without departing from what is considered to be the scope of the invention.

I claim:

1. A two-phase shift register bit apparatus having an input terminal for receiving bits of data, an output terminal for providing bits of data, power supply and ground terminals, comprising:
   first transfer means consisting of a single first MOS transistor having gate, first and second terminals, means coupling said first terminal of said first MOS transistor to said input terminal of said apparatus for receiving a first data bit in one of first and second mutually exclusive states, said gate terminal of said first MOS transistor being connected to receive a first clock signal, said first data bit being transferred to said second terminal when said first clock signal is received;
   first inverter having input and output terminals, said input terminal of said first inverter being connected only to said second terminal of said first MOS transistor, said input terminal of said first inverter being a dynamic storage node with respect to at least one state of said first data bit;
   first voltage pull means connected between said input and output terminals of said first inverter for providing a first pulled voltage at said second terminal of said first MOS transistor, said first voltage pull means consisting of a single third transistor having one of first and second mutually exclusive structures in accordance with whether said first MOS transistor is of the n-channel type or p-channel type, such that, in said first structure of said first voltage pull means, when said first data bit being in said first state, said first pulled voltage at said first inverter input terminal substantially equals the voltage at said power supply terminal, and such that, in said second structure of said first voltage pull means, when said first data bit being in said second state, said first pulled voltage at said first inverter input terminal substantially equals the voltage at said ground terminal;
   second transfer means consisting of a single second MOS transistor having gate, first and second terminals with the first terminal connected only to said output terminal of said first inverter for receiving from said output terminal of said first inverter a second data bit also in one of said first and second mutually exclusive states, said gate terminal of said second MOS transistor being connected to receive a second clock signal later in time than said first clock signal, said second data bit being received when said second clock signal is received;
   second inverter having input and output terminals, said input terminal of said second inverter being connected only to said second terminal of said second MOS transistor, said input terminal of said second inverter being a dynamic storage node with respect to at least one state of said second data bit; and
   second voltage pull means connected between said input and output terminals of said second inverter for providing a second pulled voltage at said second terminal of said second MOS transistor, said second voltage pull means consisting of a single fourth transistor also having one of said first and second mutually exclusive structures in accordance with whether said second MOS transistor is of the n-channel type or p-channel type, such that, in said first structure of said second voltage pull means, when said second data bit being in said first state, said second pulled voltage at said second inverter input terminal substantially equals the voltage at said power supply terminal, and such that, in said second structure of said second voltage pull means, when said second data bit being in said second state, said second pulled voltage at said second inverter input terminal substantially equals the voltage at said ground terminal.

2. A two-phase shift register bit apparatus as in claim 1 wherein said first voltage pull means comprises a third MOS transistor of opposite channel type as said first MOS transistor.

3. A two-phase shift register bit apparatus as in claim 1 wherein said second voltage pull means comprises a fourth MOS transistor of opposite channel type as said second MOS transistor.

* * * * *